(12) United States Patent
Asamura

(10) Patent No.: US 7,256,658 B2
(45) Date of Patent: Aug. 14, 2007

(54) SURFACE MOUNT CRYSTAL OSCILLATOR

(75) Inventor: Fumio Asamura, Saitama (JP)

(73) Assignee: Nihon Dempa Kogyo Co., Ltd., Shibuya-ku, Tokyo (JP)

(*) Notice: Subject to any disclaimer, the term of this patent is extended or adjusted under 35 U.S.C. 154(b) by 91 days.

(21) Appl. No.: 11/190,748

(22) Filed: Jul. 27, 2005

(65) Prior Publication Data
US 2006/0022762 A1    Feb. 2, 2006

(30) Foreign Application Priority Data
Jul. 30, 2004   (JP)   ............... 2004-223393

(51) Int. Cl.
*H03H 9/10*   (2006.01)
*H03B 5/32*   (2006.01)
(52) U.S. Cl. ............... 331/68; 331/108 D; 331/158; 310/348
(58) Field of Classification Search ............... 331/68, 331/158, 108 D
See application file for complete search history.

(56) References Cited

U.S. PATENT DOCUMENTS 7,123,108 B2 * 10/2006 Isimaru ............... 331/68
2004/0085147 A1 * 5/2004 Harima et al. ............... 331/158
2004/0174092 A1 * 9/2004 Iwata ............... 310/324

FOREIGN PATENT DOCUMENTS

JP      2003-087056      3/2003

* cited by examiner

*Primary Examiner*—Joseph Chang
(74) *Attorney, Agent, or Firm*—Muirhead and Saturnelli, LLC

(57) ABSTRACT

A surface mount quartz crystal oscillator includes: a quartz crystal unit having a plurality of first connection terminals on its bottom surface, and a mounting substrate formed with a depression, which accommodates an IC chip inside the depression. The side of the mounting substrate having the opening of the depression bonds with the bottom surface of the crystal unit. The IC chip integrates an oscillation circuit that employs the crystal unit and a temperature compensation circuit. Second connection terminals corresponding to the first connection terminals are provided on the upper surface of the frame wall that encloses the depression in the mounting substrate. A notched portion is formed in the frame wall, and resin is injected from this notched portion into the depression to fill at least the region between the first connection terminals.

8 Claims, 3 Drawing Sheets

SURFACE MOUNT CRYSTAL OSCILLATOR

BACKGROUND OF THE INVENTION

1. Field of the Invention

The present invention relates to a surface mount quartz crystal oscillator in which a quartz crystal unit and an oscillation circuit using the crystal unit are arranged as a single unit to constitute the surface mount crystal oscillator, and more particularly to a surface mount crystal oscillator that prevents changes in oscillation frequency after mounting on a wiring board.

2. Description of the Related Art

Due to their small size and light weight, surface mount crystal oscillators are widely employed as reference sources for frequency and time in portable electronic apparatuses. In a typical surface mount crystal oscillator, as disclosed in, for example, Japanese Patent Laid-Open Publication No. 2003-87056 (JP, P2003-87056A), an IC (integrated circuit) chip that constitutes an oscillation circuit is accommodated on a mounting substrate having a depression, and this mounting substrate is then bonded to the bottom surface of the crystal unit.

FIG. 1A is a partial cutaway front view of a surface mount crystal oscillator of the prior art, and FIG. 1B is a plan view showing mounting substrate 2 used in this crystal oscillator. In FIG. 1A, the mounting substrate is shown as a sectional view taken along the A—A line in FIG. 1B.

A surface mount crystal oscillator is generally composed of crystal unit 1 and mounting substrate 2.

Crystal unit 1 is a construction in which a quartz crystal blank (not shown) is accommodated in a receptacle, which is a substantially rectangular parallelepiped of low height, the crystal blank being hermetically sealed by capping with metal cover 3. Connection terminals used for connecting crystal unit 1 with mounting substrate 2 are provided at the four corners of the bottom surface of the crystal unit. The connection terminals are composed of, for example, a pair of crystal terminals for connecting electrically to the crystal blank which are arranged at both ends of one diagonal line on the bottom surface of crystal unit 1 and a pair of ground terminals for connecting electrically to cover 3 which are arranged at both ends of the other diagonal line.

Mounting substrate 2 is composed of laminated ceramics in which the depression is formed by stacking a bottom wall and a frame wall, IC chip 4 being accommodated in this depression. IC chip 4 integrates an oscillation circuit that uses crystal unit 1 and a temperature compensation circuit for implementing temperature compensation of the oscillation frequency. Connection terminals 5 for connecting with the connection terminals on the crystal unit side are formed at the four corners of the upper surface of the frame wall that surrounds the opening of the depression of mounting substrate 2. Mounting terminals 11 that are used when mounting this surface mount crystal oscillator on a wiring board are provided at the four corners of the closed face, that is, the bottom surface, of mounting substrate 2. Mounting terminals 11 include power supply terminals, output terminals, ground terminals and the like. Write terminals 12 are provided on the side surface of mounting substrate 2, these write terminals 12 being used for writing temperature compensation data to the temperature compensation circuit in IC chip 4 or for the adjustment of the oscillation frequency. All of these connection terminals 5, mounting terminals 11, and write terminals 12 are electrically connected to IC chip 4 by conductive paths (not shown) provided on mounting substrate 2.

IC chip 4 is secured by means of ultrasonic thermal compression using bumps 6 to the inside bottom surface of the depression of mounting substrate 2. Here, the surface of IC chip 4 on which circuit elements are formed confronts the inside bottom surface of the depression. Resin is then injected as what is referred to as "underfill" 7 between the inside bottom surface of the depression and the surface of IC chip 4 on which circuit elements are formed for the purpose of protecting the circuit elements formed on IC chip 4, and the resin is then cured.

The side of mounting substrate 2 having the opening in which IC chip 4 has been mounted and underfill 7 has been injected is next bonded by solder 8 to the bottom surface of crystal unit 1 such that the connection terminals on the crystal unit side and connection terminals 5 on the mounting substrate side are connected together, following which this crystal oscillator is completed by writing temperature compensation data from write terminals 12 to IC chip 4 and then adjusting the oscillation frequency, or more specifically, the nominal oscillation frequency. After completion, the surface mount crystal oscillator is mounted on a wiring board of the apparatus which is to use this surface mount crystal oscillator.

However, various apparatuses which are provided with surface mount crystal oscillators are also provided with electronic devices and electronic components in addition to the surface mount crystal oscillator, and these electronic devices and electronic components are also mounted on the wiring board. Among these electronic devices are included, for example, chip scale package (CSP) ICs. When CSP ICs are mounted on a wiring board, a protective resin for covering and protecting the CSP ICs is later applied to the wiring board. In such cases, when a surface mount crystal oscillator is adjacent to a CSP IC on the wiring board, the protective resin will also be applied to the surface mount crystal oscillator. In the above-described surface mount crystal oscillator, a gap d measuring approximately 0.05 mm exists between crystal unit 1 and mounting substrate 2, this gap corresponding to the thickness of the layer of, for example, solder 8 that was used for bonding crystal unit 1 and mounting substrate 2, and the protective resin will penetrate this gap between crystal unit 1 and mounting substrate 2. This intrusion of protective resin produces a stray capacitance between connection terminals which are provided on the bottom surface of crystal unit 1 and between these terminals and the ground potential, and this stray capacitance is added to the load capacitance from the perspective of the crystal unit, with the resulting problem of a drop in the oscillation frequency of the crystal oscillator.

Even when no CSP ICs are present on the wiring board, surface mount crystal oscillators are sometimes intentionally covered with adhesive after mounting on the wiring board for the purpose of increasing the bonding strength between the surface mount crystal oscillator and the wiring board, and in such cases, the same problem occurs in which the oscillation frequency similarly drops.

SUMMARY OF THE INVENTION

It is an object of the present invention to provide a surface mount crystal oscillator that prevents changes in the oscillation frequency after mounting on a wiring board.

The object of the present invention is achieved by a crystal oscillator that includes a crystal unit having a first connection terminal on its bottom surface, and a mounting substrate formed with a depression, which accommodates an IC chip inside the depression, and in which the side of the mounting substrate having the opening of the depression is bonded to the bottom surface of the crystal unit; wherein a second connection terminal corresponding to the first connection terminal is provided on the upper surface of the frame wall which encloses the depression on the mounting substrate; and wherein a notched portion is formed in the frame wall and resin is injected from the notched portion into the depression.

In this crystal oscillator, resin injected from the notched portion of the frame wall fills the gap between the crystal unit and the mounting substrate to prevent the inflow of protective resin into this gap after mounting on the wiring board. This injected resin thus prevents changes in the stray capacitance between connection terminals after mounting this crystal oscillator on the wiring board, and consequently, prevents changes in the oscillation frequency.

The object of the present invention is also achieved by a crystal oscillator that includes: a crystal unit having a plurality of first connection terminals on its bottom surface, and a mounting substrate having a depression, which accommodates an IC chip in the depression, and in which the side of the mounting substrate having the opening of the depression is bonded to the bottom surface of the crystal unit; wherein second connection terminals corresponding to the first connection terminals are provided on the upper surface of the frame wall which encloses the depression on the mounting substrate; and wherein an insulating film is formed between the first connection terminals on the bottom surface of the crystal unit.

In this crystal oscillator, the insulating film that is provided on the rear surface of the crystal unit prevents the inflow of protective resin into the gap between the crystal unit and the mounting substrate after mounting on the wiring board. As a result, changes in the stray capacitance between connection terminals after mounting this crystal oscillator on the wiring board can be prevented, and changes in the oscillation frequency can be prevented.

In the present invention, write terminals used for adjusting the crystal oscillator may be provided exposed on the surface of the mounting substrate, whereby the oscillation frequency can be adjusted after the mounting substrate has been bonded to the bottom surface of the crystal unit and resin injected.

DETAILED DESCRIPTION OF THE PREFERRED EMBODIMENTS

Figure 1A:
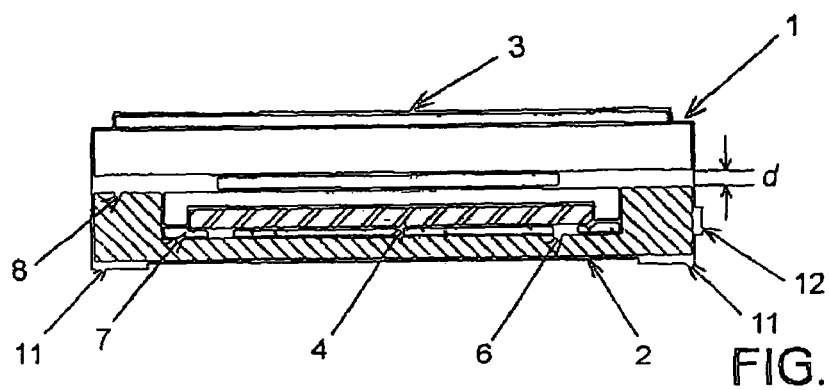
FIG. 1A is a partial cutaway front view of an example of the configuration of a surface mount crystal oscillator of the prior art.
Figure 1B:
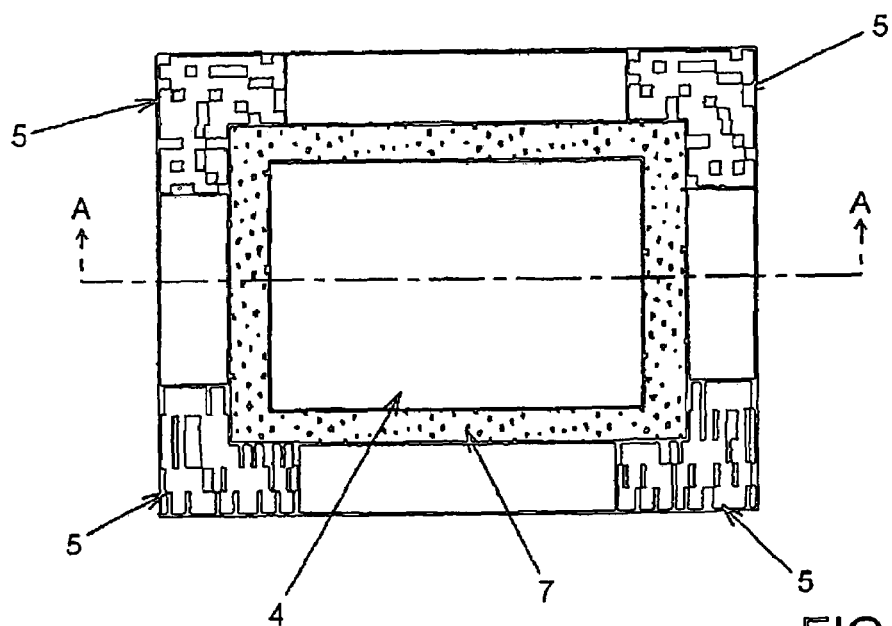
FIG. 1B is a plan view showing the mounting substrate which is used in the surface mount crystal oscillator shown in FIG. 1A.
Figure 2A:
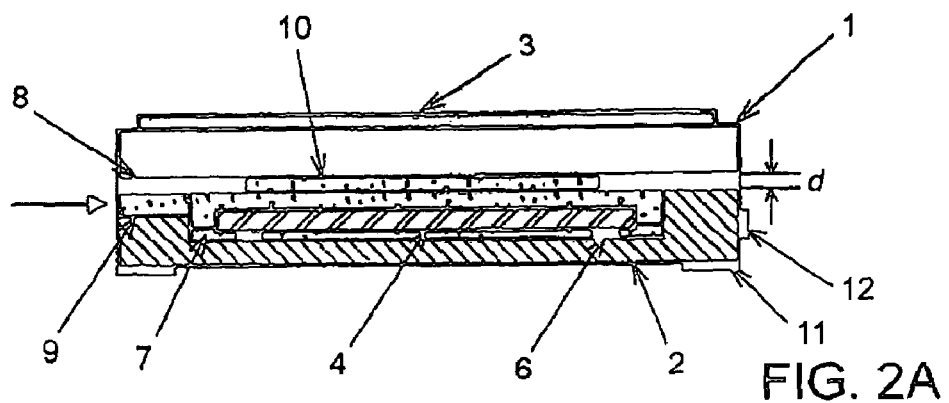
FIG. 2A is a partial cutaway front view showing the configuration of a surface mount crystal oscillator according to an embodiment of the present invention.
Figure 2B:
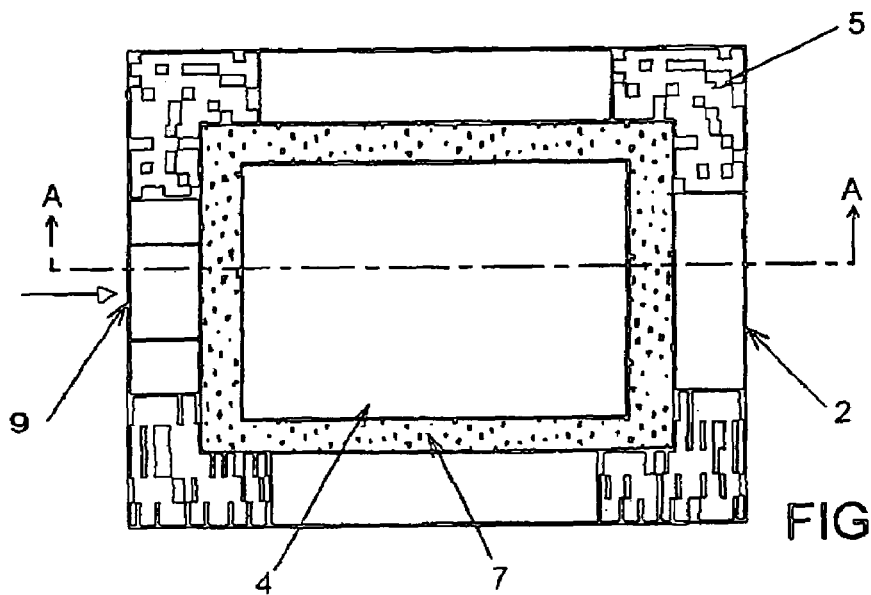
FIG. 2B is a plan view showing the mounting substrate which is used in the surface mount crystal oscillator shown in FIG. 2A.
Figure 2C:
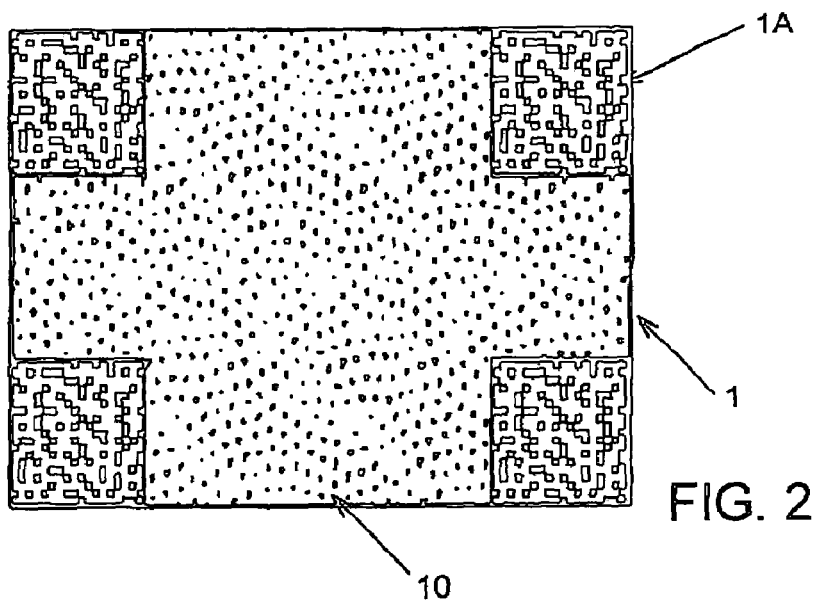
FIG. 2C is a bottom view showing the crystal unit which is used in the surface mount crystal oscillator shown in FIG. 2A.

FIGS. 2A to 2C show a surface mount quartz crystal oscillator according to an embodiment of the present invention. In these figures, constituent elements that are identical to components that are shown in FIGS. 1A and 1B are given the same reference numerals, and redundant explanation regarding these constituent elements is not repeated.

The surface mount crystal oscillator of the present embodiment is a device in which mounting substrate 2 which accommodates IC chip 4 is bonded to the bottom surface of quartz crystal unit 1, as with the oscillator that was shown in FIGS. 1A and 1B. In FIG. 2A, which is a front view of the crystal oscillator, mounting substrate 2 is shown as a sectional view that is taken along line A—A in FIG. 2B.

Crystal unit 1, in which a quartz crystal blank is hermetically sealed inside a receptacle, is equivalent to the component which is shown in FIG. 1A, has a low, substantially rectangular parallelepiped shape, and has connection terminals 1A such as shown in FIG. 2C formed at the four corners of the outer bottom surface of crystal unit 1.

Substantially rectangular mounting substrate 2 is also equivalent to the component shown in FIGS. 1A and 1B, and is composed of laminated ceramics in which a bottom wall having a planar shape and a frame wall having a shape along four sides of a rectangle are stacked to form a depression. IC chip 4 is accommodated inside the depression, and resin is injected and cured as underfill 7 between the inside bottom surface of the depression and the surface of IC chip 4 on which the circuit elements have been formed. Connection terminals 5 for connecting with connection terminals 1A on the crystal unit side are formed at each of the four corners of the upper surface of the frame wall that surrounds the opening of the depression of mounting substrate 2. Mounting terminals 11 are formed on the outer bottom surface of mounting substrate 2, and write terminals 12 are provided on the outer side surface of mounting substrate 2. Mounting substrate 2 of this type is bonded to the bottom surface of crystal unit 1 by solder 8 on the side of the mounting substrate 2 having the opening such that connection terminals 1A on the crystal unit side and connection terminals 5 on the mounting substrate side are connected together.

The differences between the crystal oscillator of the present embodiment and the crystal oscillator that is shown in FIGS. 1A and 1B in that notched portion 9 is formed in a portion of the frame wall that defines the depression of mounting substrate 2, and following the bonding of the bottom surface of crystal unit 1 to mounting substrate 2, electrically insulating resin 10 is injected from notched portion 9 to fill the gap between crystal unit 1 and mounting substrate 2 with resin and thus plug this gap. The position in which notched portion 9 is provided is a position between adjacent connection terminals 5. As shown in FIG. 2C, resin 10 spreads over the bottom surface of crystal unit 1 and fills the resin between connection terminals 1A. After resin 10 has cured, temperature compensation data are written from write terminals 12 to IC chip 4 and the oscillation frequency adjusted, whereby this surface mount crystal oscillator is completed.

In a surface mount crystal oscillator of this configuration, the oscillation frequency is adjusted while taking into account the electric capacitance caused by the presence of resin 10 between connection terminals 1A. Despite the subsequent mounting of this surface mount crystal oscillator onto a wiring board and the application of protective resin, the presence of resin 10 prevents the intrusion of protective resin into the gap between crystal unit 1 and mounting substrate 2, and as a result, no changes occur in the oscillation frequency that are caused by the application of protective resin after mounting to the wiring board.

If it is supposed that the gap between crystal unit 1 and mounting substrate 2 is not completely filled by resin 10 and that the protective resin therefore intrudes into this gap, the previous injection of resin 10 and the application of resin 10 between connection terminals 1A prevents any significant change in the stray capacitance between connection terminals 1A, and as a result, substantially no change occurs in the oscillation frequency.

Thus, in the surface mount crystal oscillator according to the present embodiment, changes in oscillation frequency can be prevented after mounting on a wiring board. In the preceding explanation, notched portion 9 was formed in one location of the frame wall, but notched portions may of course be provided in a plurality of locations of the frame wall. In addition, a hole that passes through the frame wall may also be provided as notched portion 9.

Figure 3A:
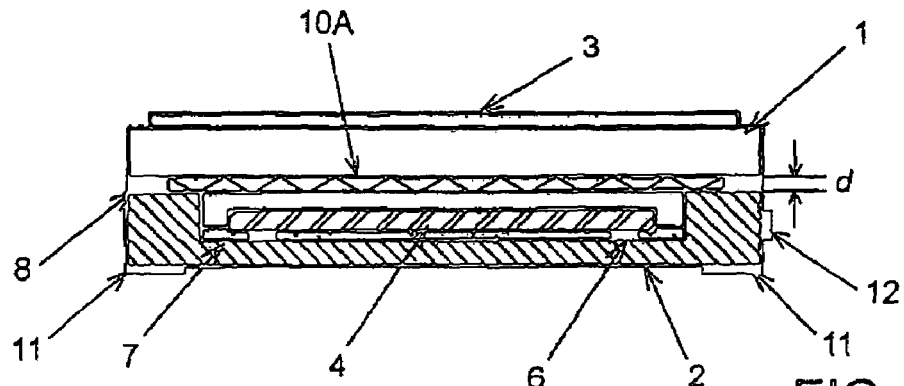
FIG. 3A is a partial cutaway front view showing the configuration of a surface mount crystal oscillator according to another embodiment of the present invention.
Figure 3B:
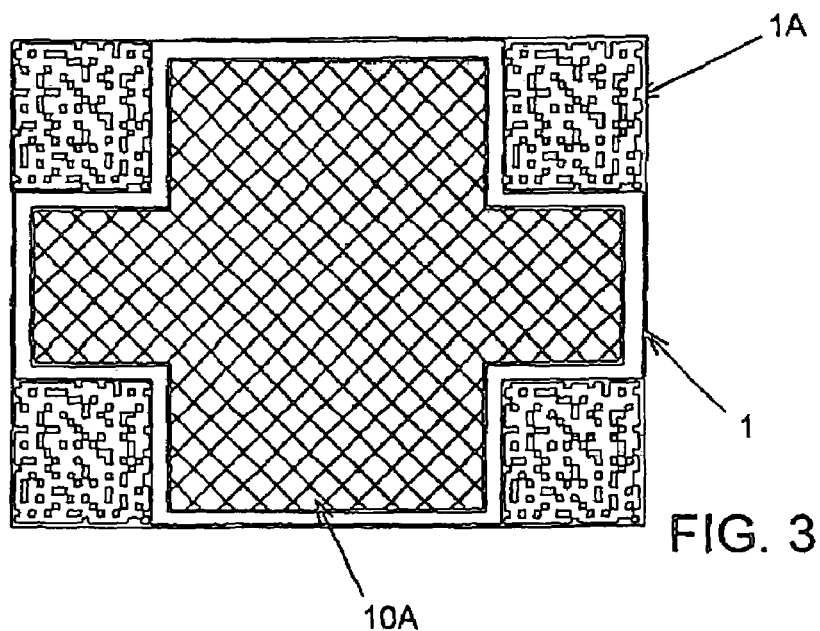
FIG. 3B is a bottom view showing the crystal unit which is used in the surface mount crystal oscillator shown in FIG. 3A.

FIGS. 3A and 3B shows a surface mount crystal oscillator according to another embodiment of the present invention. This surface mount crystal oscillator is a configuration in which, instead of providing a notched portion in the frame wall of the mounting substrate and then injecting resin, insulating film 10A is formed on the rear surface of crystal unit 1. Insulating film 10A is formed over substantially the entire surface of the rear surface of crystal unit 1 with the exception of the positions of formation of connection terminals 1A. Insulating film 10A is formed by, for example, adhering a polyimide resin film, or by applying a resin to the rear surface of crystal unit 1. The thickness of insulating film 10A is on the order of 0.05 mm, which is the dimension of gap d between crystal unit 1 and mounting substrate 2.

Surface mount crystal oscillator of this configuration is assembled by first providing insulating film 10A on the outer bottom surface of crystal unit 1 and then bonding mounting substrate 2 in which IC chip 4 has been accommodated to the bottom surface of crystal unit 1 as previously described.

In this surface mount crystal oscillator, insulating film 10A that has been provided on the bottom surface of crystal unit 1 prevents the intrusion of protective resin between connection terminals 1A, and accordingly, this configuration can prevent changes in oscillation frequency after mounting the crystal oscillator on the wiring board as in the surface mount crystal oscillator of the above-described embodiment.

What is claimed is:

1. A crystal oscillator, comprising:
    a crystal unit having a first connection terminal on a bottom surface thereof; and
    a mounting substrate formed with a depression, which accommodates an IC chip inside said depression, and in which a side of said mounting substrate having an opening of said depression is bonded to the bottom surface of said crystal unit;
    wherein a second connection terminal corresponding to said first connection terminal is provided on an upper surface of a frame wall which encloses said depression in said mounting substrate, and
    a notched portion is formed in said frame wall and resin is injected from said notched portion into said depression.

2. The crystal oscillator according to claim 1, comprising a plurality of said second connection terminals; wherein said notched portion is provided in said frame wall at a position between two adjacent connection terminals.

3. The crystal oscillator according to claim 2, comprising a plurality of said first connection terminals, wherein said resin is applied to the bottom surface of said crystal unit in a region between said first connection terminals.

4. The crystal oscillator according to claim 1, wherein said IC chip, together with said crystal unit, makes up an oscillation circuit.

5. The crystal oscillator according to claim 4, wherein write terminals used for adjusting said crystal oscillator are provided exposed on said mounting substrate.

6. A crystal oscillator, comprising:
    a crystal unit having a plurality of first connection terminals on a bottom surface thereof; and
    a mounting substrate formed with a depression, which accommodates an IC chip inside said depression, and in which a side of said mounting substrate having an opening of said depression is bonded to the bottom surface of said crystal unit;
    wherein second connection terminals corresponding to said first connection terminals are provided on an upper surface of a frame wall which encloses said depression in a mounting substrate; and
    an insulating film is formed in the region between said first connection terminals on the bottom surface of said crystal unit.

7. The crystal oscillator according to claim 6, wherein said IC chip, together with said crystal unit, makes up an oscillation circuit.

8. The crystal oscillator according to claim 7, wherein write terminals used for adjusting said crystal oscillator are provided exposed on said mounting substrate.

* * * * *